United States Patent [19]
Challa

[11] Patent Number: 5,357,465
[45] Date of Patent: Oct. 18, 1994

[54] SINGLE TRANSISTOR EEPROM MEMORY CELL

[75] Inventor: Nagesh Challa, Sunnyvale, Calif.

[73] Assignee: Nexcom Technology, Inc., Sunnyvale, Calif.

[21] Appl. No.: 26,940

[22] Filed: Mar. 5, 1993

Related U.S. Application Data

[63] Continuation of Ser. No. 625,807, Dec. 11, 1990, Pat. No. 5,222,040.

[51] Int. Cl.⁵ ............................................. G11C 13/00
[52] U.S. Cl. ................................... 365/185; 365/149; 365/182
[58] Field of Search ............... 365/49, 185, 149, 150, 365/182, 189.01, 230.01

[56] References Cited

U.S. PATENT DOCUMENTS

| | | | |
|---|---|---|---|
| 4,366,555 | 12/1982 | Hu | 365/185 |
| 4,698,787 | 10/1987 | Mukherjee et al. | 365/185 |
| 4,758,986 | 7/1988 | Kuo | 365/185 |
| 4,884,239 | 11/1989 | Ono et al. | 365/185 |
| 4,903,236 | 2/1990 | Nakayama et al. | 365/185 |
| 4,958,321 | 8/1990 | Chang | 365/185 |
| 4,959,812 | 8/1990 | Momodomi et al. | 365/185 |
| 4,962,481 | 10/1990 | Choi et al. | 365/185 |
| 4,996,571 | 2/1991 | Kume et al. | 357/23.5 |
| 4,996,668 | 2/1991 | Paterson et al. | 365/185 |

FOREIGN PATENT DOCUMENTS 0218342  4/1987  European Pat. Off.
0313427  4/1989  European Pat. Off.

OTHER PUBLICATIONS

Paper entitled: "A 5-Volt Contactless Array 256KBIT Flash EEPROM Technology" by Texas Instruments, Inc., Copyright date of 1988.

Primary Examiner—Terrell W. Fears
Attorney, Agent, or Firm—Skjerven, Morrill, MacPherson, Franklin & Friel

[57] ABSTRACT

A single-transistor non-volatile memory cell MOS transistor with a floating gate and a control gate using two levels of polysilicon and a tunnel dielectric that overlaps the drain area wherein a tunneling of charge can take place between the drain and the floating gate by means of a system of applied voltages to the control gate and drain.

45 Claims, 3 Drawing Sheets

SINGLE TRANSISTOR EEPROM MEMORY CELL

CROSS-REFERENCES TO RELATED APPLICATION

This application is a continuation of copending and commonly assigned U.S. patent application Ser. No. 07/625,807, filed Dec. 11, 1990, now U.S. Pat. No. 5,222,040.

BACKGROUND OF THE INVENTION

1. Field of the Invention

The invention relates generally to nonvolatile computer memory devices, and more specifically to very high density devices made possible by using one as opposed to two transistors per memory cell.

2. Description of the Prior Art

Electrically programmable read only memory (EPROM) cells are among the smallest memory cells in the prior art. Electrically erasable EPROMs (called E²PROMs) traditionally have had larger cell sizes because two transistors were necessary for each memory cell. Some so called "flash" EPROMs also have cells as small as EPROMs. Flash memories sort themselves into two basic approaches, distinguished by whether they require one or two voltage supplies. (See, Samuel Weber, "Look Out, Here Comes Flash," *Electronics,* November 1990, pp. 44–50.) These designs also differ in their cell structure—whether they require one or several transistors per cell. Intel Corporation (Santa Clara, Calif.) has a one-transistor self-aligned stacked-gate cell, based on its proprietary ETOX (EPROM tunnel-oxide) technology. Intel recently announced a very high density flash device, the 28F020, that stores two megabits. Catalyst, Excel, Hitachi, Mitsubishi, and Toshiba all offer competing devices. A problem with the single-transistor cell is the possibility of over-erasure and consequent current leakage. This can result in false data readings when a cell in the zero state receives an erase pulse that drives it into the depletion mode. The column-sense amplifier will read this incorrectly as an erased cell. Intel, and others, have overcome this with a programming algorithm that first programs up all the cells on a chip to a "one" before erasing. Seeq Technology (San Jose, Calif.) solves the problem by using a different cell structure. A split-gate cell amounts to a two-transistor architecture, but takes only a little more chip area than a single transistor cell. (According to Weber, supra.) Through a diffusion process, the split-gate creates a phantom transistor that looks like a series transistor. This allows the cell to be isolated from others in a column. The Seeq devices (e.g., 48F512 and 48F010) have the ability to do sector-erase of any of 128 columns. Samuel Weber (supra) expects Mitsubishi Corp. (Japan) to show a single-transistor, stacked-gate cell of only 3.6 μm² in a 16M-bit flash at the upcoming International Electron Devices Meeting (IEDM).

Figure 1:
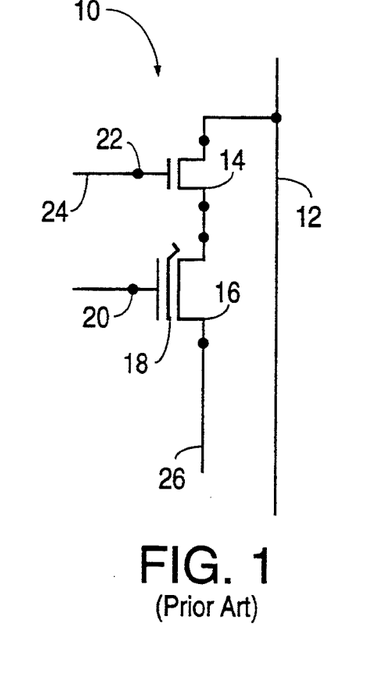
FIG. 1 is a schematic diagram of a prior art E²PROM memory cell.

FIG. 1 illustrates a typical EEPROM memory cell 10 of the prior art comprising a bit line 12, a select transistor 14, a floating gate transistor 16 having a floating gate 18 and a control gate 20, a select gate 22 connected to a word line 24, and an array source 26. Transistor 16 is a floating-gate avalanche-injection metal oxide semiconductor (FAMOS) and is well known in the prior art. (For a background of these devices see, U.S. Pat. No. 4,884,239, issued Nov. 28, 1989, to Ono, et al.). To erase cell 10, a high voltage (about 20 V) is placed on gates 20 and 22, while array source 26 and bit line 12 are at ground. The high voltage on gate 20 is coupled to floating gate 18 by virtue of capacitive coupling. The voltage on gate 18 is a function of the coupling ratio γ. (Depending on the technology used, the coupling ratio will vary, and so will the voltages used.) Therefore $V_{18} = \gamma V_{20}$. Once $V_{18}$ reaches a critical level (typically ~11 V) the field across the tunnel oxide area of transistor 16 is enough to start electron tunneling from the drain of transistor 16 to gate 18 through the thin (~100 Å) tunnel oxide. This results in a relatively high threshold voltage ($V_t$) for transistor 16. To program cell 10, control gate 20 is grounded, high voltages (~20 V) are placed on bit line 12 and select gate 22, while array source 26 is left to float. The high voltage on bit line 12 transfers through transistor 14 to the drain of transistor 16. An electric field is produced across the tunnel oxide area of transistor 16 to start tunneling of electrons in the direction opposite to the above. This results in transistor 16 having a low threshold voltage ($V_t$, which can be $-2$ V to $-3$ V). This threshold voltage is the reason that transistor 14 is needed in read mode because transistor 16 cannot be controlled for reading by gate 20. Since a high voltage on only one terminal, control gate 20 or the drain of transistor 16, is needed to program and erase, the select gate 22 is needed for these modes.

Figure 2:
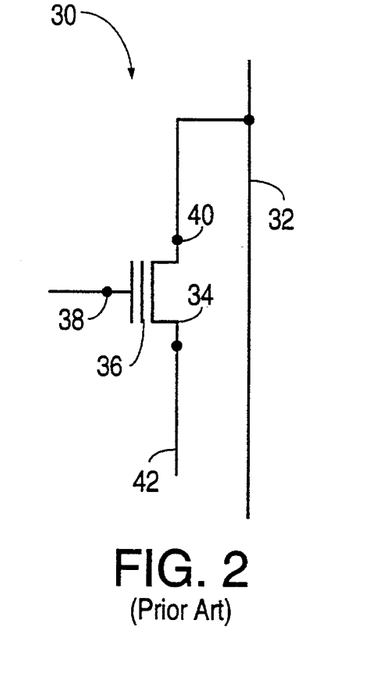
FIG. 2 is a schematic diagram of a prior art EPROM or FLASH memory cell.

FIG. 2 illustrates a prior art single-transistor flash EPROM memory cell 30 comprising a bit line 32 and a memory transistor 34 having a floating gate 36, a control gate 38 connected to a word line, a drain 40, and an array ground 42. To erase cell 30, control gate 38 and bit line 32 have a high voltage (~12 V to 15 V) applied. This puts transistor 34 in a high current mode drawing about one milliamp from bit line 32 to array ground 42. Hot electrons are generated and get trapped in floating gate 36. (This is the standard EPROM programming mode.) To program cell 30, control gate 38 is grounded and array ground 42 is at high voltage. Bit line 32 is floating and electrons tunnel through the thin gate oxide of transistor 34 to array ground 42. This results in a low $V_t$ state for transistor 34.

A pass transistor can prevent memory cells from drawing current when the floating gate structure is erased into depletion. (See, Gill, et al., "A 5-Volt Contactless Array 256KBIT Flash EEPROM Technology," IEDM 88, IEEE, pp. 428–431.) Such pass, or read select, transistors are routinely used in the prior art. A contactless cell array technology is described by Gill, et al. (supra), for a single power supply 5 V-only flash EEPROM. The contactless flash EEPROM cell is a one-transistor floating gate structure (defined by double poly stack process) merged with a series enhancement pass gate. The cell erase is accomplished by Fowler-Nordheim tunneling from floating gate to source junction by applying a negative voltage on the word line and $V_{cc} = 5$ V on the source line (Id., FIG. 4). There is no significant change in the erased state threshold voltage because of the merged pass gate. Since the floating gate structure can be over-erased into depletion, the cell $V_t$ is dominated by the pass gate characteristics.

The disadvantages of the prior art for EEPROM are that two transistors are needed, making high density difficult, and bit line 12 is at high voltage causing spacing concerns between adjacent lines. In flash EPROMs the problems are again high voltages being placed on bit lines 32, high currents needed to program the cell 30, and elimination of page mode because too much current is needed. The write operation can produce negative thresholds and complicated algorithms are necessary to work around the problem.

SUMMARY OF THE PRESENT INVENTION

An advantage of the present invention is that very high density arrays can be achieved that have the programming and reading simplicity of prior art E²PROM devices.

Another advantage of the present invention is that lower voltages can be used.

Another advantage of the present invention is that the select transistor is eliminated.

Another advantage of the present invention is that the need to submit a flash memory cell to a high current hot electron injection mode is eliminated, thus allowing page mode programming.

These and other advantages are achieved in the present invention, which in one embodiment is an EEPROM array having a plurality of EEPROM cells. The EEPROM cell comprises a control gate, a floating gate, a first device region such as, for example, a drain having a direct electrical connection to a bit line, a second device region such as, for example, a source, and a channel region disposed between the first and second device regions.

In a further embodiment, the EEPROM array further comprises a voltage source operable in the erase mode for causing electrons to tunnel to the floating gate. In a variation, the substrate is biased to reduce the high voltage supply.

In a further embodiment, the EEPROM array further comprises a voltage source operable in the program mode and having a first component applied to the control gate, and a second component applied to the bit line in response to an input logic state for determining whether electrons tunnel from the floating gate.

In a further embodiment, the EEPROM array further comprises a voltage source operable in the read mode for applying a voltage to the control gate not between a first and second $V_t$ if the word line is not selected, and between the first and second $V_t$ if the word line is selected. The polarity of the first $V_t$ may be opposite the polarity of the second $V_t$.

DETAILED DESCRIPTION OF THE PREFERRED EMBODIMENTS

Figure 3:
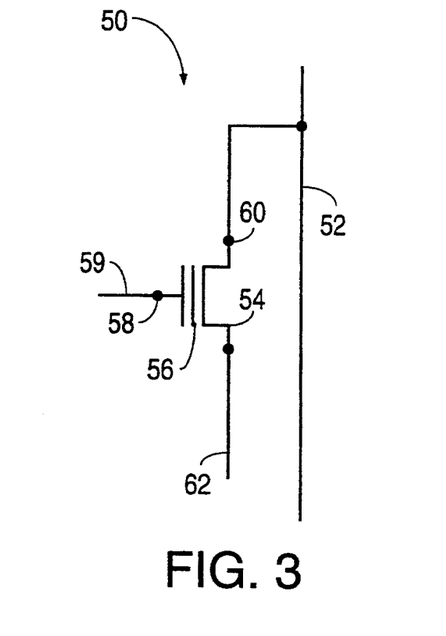
FIG. 3 is a schematic diagram of a memory cell of the present invention.

FIG. 3 is a memory cell of the present invention, referred to by the general reference numeral 50, comprising a bit line 52 and a memory transistor 54 having a floating gate 56, a control gate 58 connected to a word line 59, a drain 60, and an array source 62. An erase changes transistor 54 to a high $V_t$ state. To erase cell 50, both bit line 52 and array source 62 are grounded, and control gate 58 has a high voltage applied. This results in charging floating gate 56 with a negative charge and therefore a high threshold $V_t$. This scheme is similar to a prior art E²PROM. To program cell 50, a minus 15 V is applied to control gate 58, plus 5 V to bit line 52, and array source 62 is left floating. This results in a field across the tunnel oxide area of transistor 54 similar to that in FIG. 1 in the programming mode. Depending on the coupling ratio γ, floating gate 56 will have a net negative voltage and the drain 60 a positive 5 V. (As was said above, depending on the technology used, the coupling ratio will vary, and so will the voltages used.) Therefore, floating gate 56 will be stripped of negative charge and transistor 54 will reach a low or negative threshold state. To read memory cell 50, control gate 58 is minus 3 V if deselected and plus 3 V if selected. This eliminates the need of a select transistor. Even with transistor 54 with a negative threshold voltage, memory cell 50 will be OFF with the minus 3 V on the word line 59.

A standard flash EPROM process can be used to fabricate cell 50. The source and drain in such a cell are reversed. (The source side in a flash EPROM cell typically has the underlap diffusion (under the floating gate) to enable tunneling.)

Alternatively, a negative back bias can be used for the substrate to achieve similar operation to that described above. In this alternative case, the drain of the memory cell would be minus 5 V during erase, with the gate at plus 15 V. During programming, the drain of the memory transistor would be plus 5 V with the control gate at minus 15 V. The overall magnitude of voltage pumped would be smaller in any event. This would enable the running of the device from a lower power supply.

Figure 4:
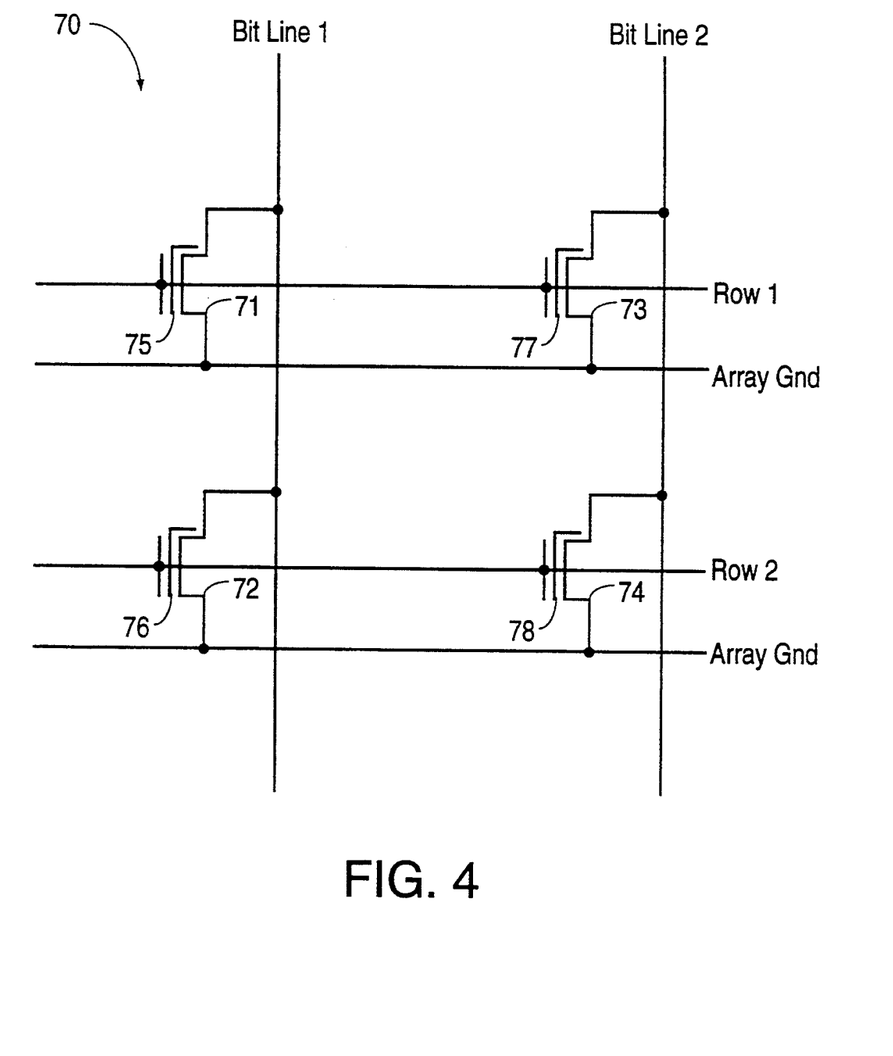
FIG. 4 is a schematic diagram of a four cell memory device.

FIG. 4 illustrates a memory device 70 comprised of a group of four memory transistors 71–74 having floating gates 75–78, respectively. Table I summarizes the operational states of bit lines one and two, and row lines one and two for erase, write, and read operations. It is important to note that none of the bit lines exceed zero to five volts in any mode. This allows the bit lines, which are customarily diffusions, to be placed closer together, thus allowing higher device densities.

TABLE I

|  | Row 1 (on) | Row 2 (unselected) | Bit Line 1 "0" | Bit Line 2 "1" | Array Gnd. |
|---|---|---|---|---|---|
| Erase (High $V_t$ "1") | +20V | 0V | 0V | 0V | 0V |
| Write (Low $V_t$ "0") | −15V | 0V | +5V | 0V | floating |
| Read | +1V | −3V | 2V | 2V | 0V |

Figure 5:
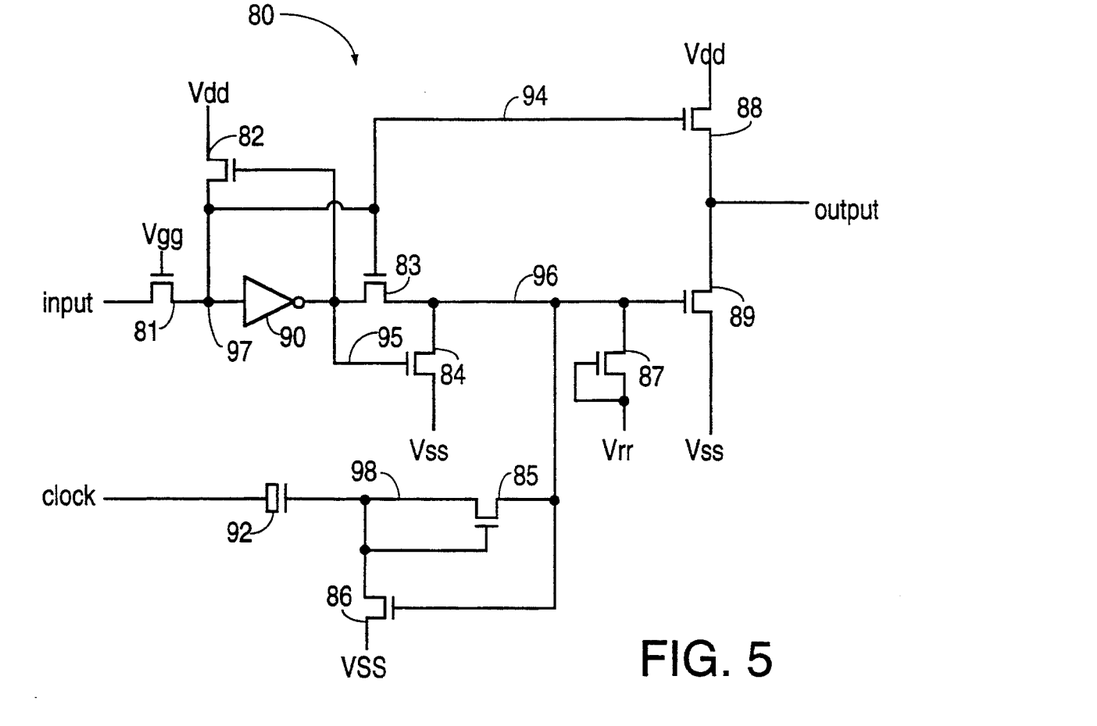
FIG. 5 is a schematic diagram of a control circuit capable of driving the row and bit lines of the devices of FIGS. 3 and 4.

FIG. 5 is a control circuit 80 that will supply the appropriate voltages in support of memory device 70 or memory cell 50. The $V_{dd}$, $V_{ss}$, and $V_{rr}$ of control circuit 80 are connected to different voltage supplies, depending on whether the output is driving a selected or an unselected row line. Control circuit 80 comprises transistors 81–89, inverter 90, and capacitor 92. Transistors 82–89 are all PMOS. All PMOS substrates (n-well) are tied to $V_{dd}$. Control circuit 80 must transfer all the different voltages that are necessary to activate memory device 70 or memory cell 50. Table II generalizes the voltages and the modes in which they are applied.

TABLE II

|        | Selected | Deselected |
|--------|----------|------------|
| Read   | +3V      | −3V        |
| Erase  | +20V     | 0V/1V      |
| Program| −15V     | 1V/0V/5V   |

During erase, the output of a corresponding control circuit 80 for a selected row should be +20 V. The control circuit 80 for the row has $V_{dd}$ at +20 V, $V_{ss}$ at 0 V, $V_{rr}$ at +20 V, and clock input inactive. To select the row, the input is at 0 V. The input of 0 V causes a signal line 94 to also be at 0 V. Transistor 88 turns on and pulls the output up to +20 V. A signal line 95 goes to +20 V which turns transistor 82 off. With signal line 94 at 0 V, transistor 83 is on, and a signal line 96 is pulled up to +20 V. Thus transistor 89 is off. (No direct path from $V_{ss}$ to $V_{dd}$ exists therefore through transistors 88 and 89.)

During erase, the output of a corresponding control circuit 80 for a deselected row is pulled down to within two threshold voltages from 0 V. The input is at +5 V, causing signal line 95 to go to 0 V which turns transistor 82 on and pulls a signal line 97 to +20 V. Thus transistor 81 is off and transistor 88 is off. Transistor 83 is also off and signal line 96 is pulled down to a $V_t$ above 0 V. Transistor 89 is on till the output is pulled down to two threshold voltages from 0 V. This will not effect the deselected memory cells in any way.

During program, the output of a corresponding control circuit 80 for a selected row should be at −15 V. The control circuit 80 for the row has $V_{dd}$ at +5 V, $V_{ss}$ at −15 V, $V_{rr}$ at 0 V, and clock input active. To select the row, the input is at 5 V. Signal line 97 is pulled up to +5 V and signal line 95 is at 0 V. Transistor 88 is off since signal line 94 is +5 V and $V_{dd}$ is +5 V. Transistor 83 is off because signal line 97 is at +5 V. Transistor 84 is on to pull signal line 96 down to $V_t$ above 0 V. As the clock becomes active, transistors 85 and 86 capacitor 92 act as a charge pump pumping charge from signal line 96 to $V_{ss}$ till signal line 96 goes to one $V_t$ below $V_{ss}$. Therefore, since $V_{ss}$ is at −15 V, signal line 96 will reach about −16.5 V. When clock input goes high, signal line 98 is coupled high and immediately discharges through transistor 86. This is because signal line 98 is pumped higher than signal line 96 and momentarily turns transistor 86 on. On the falling edge of clock input, signal line 98 is coupled low below signal line 96 and transistor 85 turns on pulling signal line 96 down. As the clock input cycles through, signal line 96 is discharged to $V_{ss}$ through transistors 85 and 86. This is analogous to NMOS clocked pumps used in prior art EEPROMs. Since signal line 96 is pulled down to a $V_t$ below $V_{ss}$, the output is pulled down through transistor 89 to $V_{ss}$.

During program, the output of a corresponding control circuit 80 for a deselected row is +5 V. The input is at 0 V, causing transistor 88 to be on and transistor 89 to be off, since signal line 96 is at +5 V. The output is pulled up to +5 V through transistor 88 ($V_{dd}$= +5 V). With signal line 96 at +5 V, transistor 89 is off and the charge pump is off.

During read, the output of a corresponding control circuit 80 for a selected row should be at +2 V. The control circuit 80 for the row has $V_{dd}$ at +2 V, $V_{ss}$ at −2 V, $V_{rr}$ at −3 V, and clock input inactive. To select the row, the input is at 0 V, which causes transistor 88 to be on and transistor 89 to be off. Signal line 96 is pulled high to +2 V. Transistor 87 is a very weak transistor and will be on, providing a current path between $V_{rr}$ and $V_{dd}$ through transistor 83 and inverter 90. But by sizing the transistors 87 and 83, and by making the source of $V_{rr}$ strong, this current can be sustained and the voltage on signal line 96 can be held close to +2 V turning transistor 89 off. Therefore the output is at +2 V.

During read, the output of a corresponding control circuit 80 for a deselected row is −2 V. $V_{gg}$ is at +2 V. The input is +5 V signal line 94 is $V_t$ below $V_{gg}$ and transistor 88 is off. Transistor 83 is also off. Signal line 96 is pulled down to $V_{rr}$ through transistor 87. There is no path from $V_{rr}$ to any other power source. Transistor 89 is on and the output is pulled down to −2 V.

Figure 6:
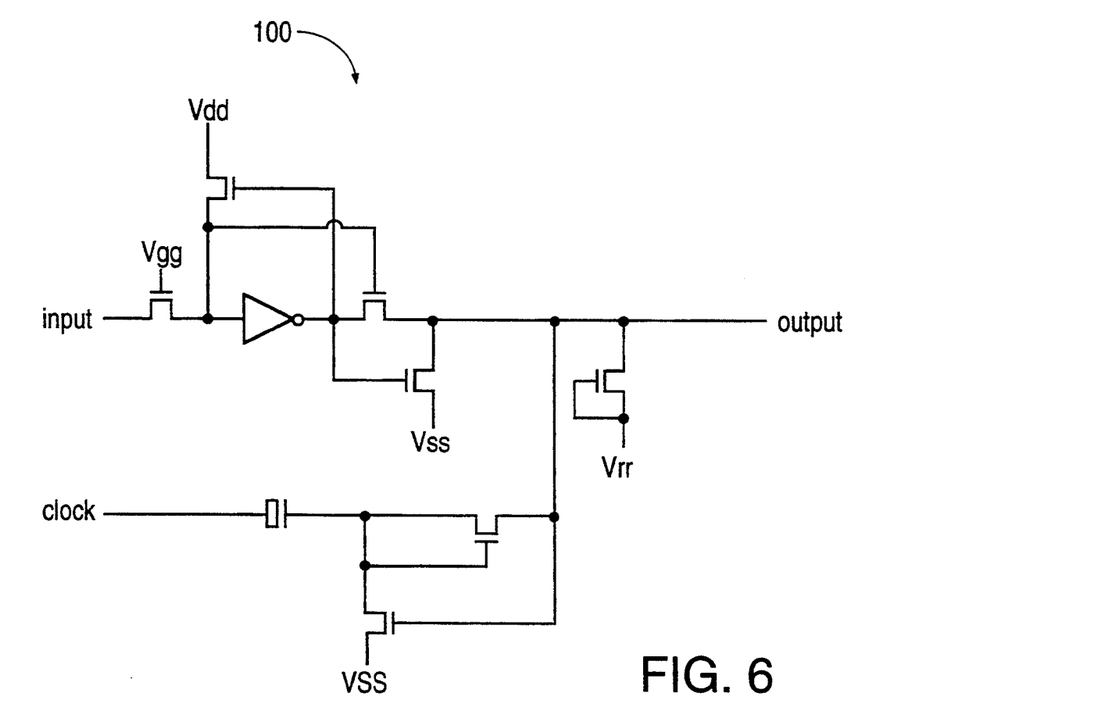
FIG. 6 is a schematic of an alternative control circuit to replace the one of FIG. 5.

FIG. 6 shows a variation of the circuit of FIG. 5. Transistors 88 and 89 of control circuit 80 have been removed and signal line 96 effectively becomes the output of a circuit 100. All modes for circuit 100 are identical to circuit 80 and work the same way.

Although the present invention has been described in terms of the presently preferred embodiments, it is to be understood that the disclosure is not to be interpreted as limiting. Various alterations and modifications not disclosed herein may be practiced without departing from the spirit of the invention, or from the scope of the invention as set forth in the following claims.

What is claimed is:

1. An electrically erasable programmable read-only memory ("EEPROM") array having a plurality of word lines, a plurality of data-carrying lines, and a plurality of EEPROM cells having respective word line—data-carrying line associations, wherein each of the EEPROM cells comprises:
   a first device region having a direct electrical connection to the associated data-carrying line;
   a second device region;
   a channel region disposed between the first and second device regions for accommodating a channel operatively induced therein between the first and second device regions;
   a floating gate overlapping the channel region and at least a part of the first device region and insulated from the first device region by a tunnel dielectric; and
   a control gate overlapping the floating gate and coupled to the associated word line.

2. An EEPROM array as in claim 1, further comprising in association with the data-carrying lines and the word lines, a voltage source for:
   in erase mode, applying a voltage across the control gate and the first device region of at least one of the EEPROM cells so that electrons tunnel through the tunnel dielectric thereof to charge the floating gate thereof; and
   in program mode, applying a voltage across the control gate and the first device region of at least one of the EEPROM cells so that electrons tunnel through the tunnel dielectric to discharge the floating gate.

3. An EEPROM array as in claim 2, wherein an erased EEPROM cell has a high $V_t$ state and a programmed EEPROM cell has a $V_t$ state lower than the high $V_t$ state.

4. An EEPROM array as in claim 1 wherein for each of the EEPROM cells, Fowler-Nordheim tunneling through the tunnel dielectric is operatively sustained at a particular potential difference across the control gate and the first device region thereof, the EEPROM array further comprising a voltage source associated with the word lines and the data-carrying lines, the voltage source being for applying a potential difference across the control gate and the first device region of one of the EEPROM cells equal to the particular potential difference to set the threshold voltage thereof.

5. An EEPROM array as in claim 4 wherein relative to ground potential, the voltage source is further for applying a first potential less than the particular potential difference to the control gate, and a second potential less than the particular potential difference to the first device region.

6. An EEPROM array as in claim 5 wherein each of the EEPROM cells is an n-channel device and the particular potential difference is twenty volts, and wherein:
for an erase operation, the first potential is plus twenty volts and the second potential is zero volts; and
for a program operation, the first potential is minus fifteen volts and the second potential is plus five volts.

7. An EEPROM array as in claim 5 wherein for each of the EEPROM cells, the voltage source is further for applying a back bias potential thereto.

8. An EEPROM array as in claim 7 wherein each of the EEPROM cells is an n-channel device and the particular potential is twenty volts, and wherein:
for an erase operation, the first potential is plus fifteen volts, the second potential is minus five volts; and the back bias potential is minus five volts; and
for a program operation, the first potential is minus fifteen volts, the second potential is plus five volts, and the back bias potential is minus five volts.

9. An EEPROM array as in claim 6 wherein each of the EEPROM cells is an n-channel device and the particular potential is twenty volts, and wherein:
for an erase operation, the first potential is plus fifteen volts, the second potential is minus five volts; and the back bias potential is minus five volts; and
for a program operation, the first potential is minus fifteen volts, the second potential is plus five volts, and the back bias potential is zero volts.

10. An EEPROM array as in claim 1, further comprising a voltage source, connected to the data-carrying lines and the word lines, for applying in the program mode a first program voltage component to the control gate of a particular one of the EEPROM cells, and for applying a second program voltage component to the first device region of the particular EEPROM cell, in response to a logic input state, the second program voltage component being:
when the input logic state differs from the erase logic state, of a magnitude and polarity relative to the first program voltage component so that electrons tunnel through the tunnel dielectric to deplete the floating gate; and
when the input logic state is equal to the erase logic state, of a magnitude and polarity relative to the first program voltage component so that electrons are unable to tunnel through the tunnel dielectric.

11. An EEPROM array as in claim 10 wherein:
each of the EEPROM cells is an n-channel device, the first device region being an n-type drain, the second device region being an n-type source, and the substrate being p-type;
the first program voltage component is minus fifteen volts; and
the second erase voltage component is plus five volts when the input logic state differs from the erase logic state, and zero volts or floating when the input logic state is equal to the erase logic state;
the voltage source being operative to place the particular EEPROM cell in a low or negative $V_t$ state when the input logic state differs from the erase logic state.

12. An EEPROM array as in claim 1 wherein first particular ones of the EEPROM cells are operable during an erase cycle to acquire a first $V_t$ value representative of an erased logic state, and second particular ones of the EEPROM cells are operable during a program cycle to acquire, in response to an input logic state, a second $V_t$ value representative of a programmed logic state if the input logic state is not equal to the erased logic state, further comprising a voltage source connected to the word lines and operative to read third particular ones of the EEPROM cells by applying a select voltage between the first and second $V_t$ values to the control gates thereof and by apply a deselect voltage not between the first and second $V_t$ values to the control gates of the EEPROM cells other that the third particular ones of the EEPROM cells.

13. An EEPROM array as in claim 12 wherein:
each of the EEPROM cells is an n-channel device, the first device region being an n-type drain, the second device region being an n-type source, and the substrate being p-type;
the first $V_t$ value is positive; and
the second $V_t$ value is negative.

14. An EEPROM array as in claim 13 wherein the select voltage is positive and the deselect voltage is negative.

15. An electrically erasable programmable read-only memory ("EEPROM") having an erase mode for erasing memory, a program mode for programming a current logic value to a selected word of the memory, and a read mode for reading a stored logic value from the memory, comprising:
a word line;
a bit line;
a common line;
a transistor having a control terminal connected to the word line, a first current terminal connected to the bit line, and a second current terminal connected to the common line, the transistor having a setable threshold determined by the magnitude and polarity of a potential difference across the control terminal and the first current terminal; and
a multiple voltage source connected to the word line, the bit line, and the common line, the voltage source being:
operable in the erase mode for applying voltage to the word line and the bit line to set a first threshold of a particular polarity in the transistor indicative of an erased logic state;
operable in the program mode when the current logic value is indicative of a logic state opposite the erased logic state for applying voltage to the word line and the bit line to set a second threshold of a polarity opposite the polarity of the first threshold in the transistor if the word line is selected indicative of a programmed logic state; and
operable in the read mode for applying a voltage to the control terminal not between the first and second threshold if the word line is not selected, and to apply a voltage to the control terminal between the first and second threshold voltage if the word line is selected, the bit line and the common line being operable to indicate whether the transistor is set to the erased logic state or the programmed logic state.

16. An EEPROM memory as in claim 15 wherein the transistor is a field effect transistor comprising:
a drain disposed in a semiconductor body and connected to the first current terminal;
a source disposed in the semiconductor body and connected to the second current terminal;
a floating gate disposed over a channel region of the semiconductor body between the source and drain and insulated therefrom, and over a part of the drain and insulated therefrom by a tunnel dielectric; and
a control gate disposed over the floating gate and insulated therefrom, the control gate being connected to the control terminal.

17. An EEPROM memory as in claim 16 wherein the first threshold is a positive threshold and the second threshold is a negative threshold, the EEPROM memory being operable in the read mode so that:
if the word line is not selected, a voltage less than the negative threshold is applied to the word line so that the transistor does not cause a current to flow in the bit line; and
if the word line is selected, the transistor does not cause a current to flow in the bit line if the transistor is set to the positive threshold, and the transistor causes a current to flow in the bit line if the transistor is set to the negative threshold.

18. An EEPROM memory as in claim 15 wherein the multiple voltage source is connected for applying voltages to the word line during the erase, program and read modes that delineate a first voltage range, and for applying voltages to the bit line during the erase, program and read modes that delineate a second voltage range narrower than the first voltage range.

19. An EEPROM memory as in claim 18, wherein the first voltage range is from minus fifteen to plus twenty volts, and the second voltage range is from zero to five volts.

20. An EEPROM memory as in claim 15, wherein the multiple voltage source is connected for applying voltages to the bit line that do not disturb the first threshold setting of the transistor when the word line is deselected.

21. An EEPROM memory as in claim 20, wherein:
the bit line is a diffused region of a first conductivity type disposed in a semiconductor body region of a second conductivity type; and
the multiple voltage source has a voltage terminal connected to the bit line diffused region and a reference voltage terminal connected to the semiconductor body region, the read mode bit line voltage, the erase mode bit line voltage, and the program mode bit line voltage being defined relative to the semiconductor body region reference voltage.

22. An EEPROM memory as in claim 21, wherein the multiple voltage source is for providing voltages at the bit line voltage terminal no greater than about five volts and no less than about minus five volts during the read mode, the erase mode, and the program mode, relative to the reference voltage terminal.

23. A method for controlling the operation of a floating gate electrically erasable programmable read-only single transistor memory cell in which the transistor is a field effect transistor having a source, a drain, a floating gate and a control gate, comprising the steps of:
placing the transistor in a first state by applying a first voltage having a first polarity across the control gate and the drain of the transistor to cause electrons to tunnel across a gate oxide insulating the floating gate from an underlying part of the drain and accumulate in the floating gate to establish a first threshold voltage, a greater portion of the magnitude of the first voltage being applied to the control gate than to the drain; and
placing the transistor in a second state by applying a second voltage having a polarity opposite the polarity of the first voltage across the control gate and the drain of the transistor to cause electrons to tunnel across the gate oxide and be removed from the floating gate to establish a second threshold voltage, a greater portion of the magnitude of the second voltage being applied to the control gate than to the drain.

24. A method as in claim 23, wherein:
the first voltage is twenty volts, twenty volts being applied to the gate and zero volts being applied to the drain; and
the second voltage is twenty volts, minus fifteen volts being applied to the gate and plus five volts being applied to the drain.

25. A method as in claim 23, further comprising the steps of:
applying a read operating voltage to the source and the drain; and
reading the state of the transistor by applying a voltage between the first threshold voltage and the second threshold voltage to the gate, and detecting whether current flows through the memory cell to read the memory cell.

26. A method as in claim 23, further comprising the steps of:
applying a read operating voltage to the source and the drain; and
preventing the reading of the state of the transistor by applying a voltage lower that both the first threshold and the second threshold to the gate to prevent current from flowing through the transistor.

27. An electrically erasable programmable read-only memory ("EEPROM") having an erase mode for erasing data from the memory, a write mode for writing data to the memory, and a read mode for reading data from the memory, comprising:
a plurality of word lines;
a plurality of bit lines crossing the word lines to form word line - bit line pairs;
a common line;
a plurality of setable threshold, single transistor memory cells respectively associated with the word line - bit line pairs, and each memory cell having a field effect transistor formed on a semiconductor substrate and having a control terminal connected to the associated word line, a first current terminal connected to the associated bit line, and a second current terminal connected to the common line; and
a multiple voltage source connected to the word lines, the bit lines, and the common line for furnishing in erase mode a low magnitude voltage of a first polarity to each of the bit lines and the substrate, and a first high magnitude voltage of a second polarity opposite the first polarity to each selected word line, wherein the difference between the first high magnitude voltage and the first low magnitude voltage is sufficient to change a memory cell to the first threshold.

28. An electrically erasable programmable read-only memory ("EEPROM") having an erase mode for erasing data from the memory, a write mode for writing data to the memory, and a read mode for reading data from the memory, comprising:
   a plurality of word lines;
   a plurality of bit lines crossing the word lines to form word line - bit line pairs;
   a common line;
   a plurality of setable threshold, single transistor memory cells respectively associated with the word line - bit line pairs, said memory cells acquiring a first threshold when erased, and each memory cell having a control terminal connected to the associated word line, a first current terminal connected to the associated bit line, and a second current terminal connected to the common line; and
   a multiple voltage source connected to the word lines, the bit lines, and the common line for furnishing in write mode a reference voltage or a first low magnitude voltage of a first polarity representative of logic value to each of the bit lines and a first high magnitude voltage of a second polarity opposite the first polarity to each selected word line, wherein the difference between the first high magnitude voltage and the first low magnitude voltage is sufficient to change a memory cell from the first threshold to a second threshold, while the difference between the first high magnitude voltage and the reference potential is insufficient to change a memory cell from the first threshold.

29. An electrically erasable programmable read-only memory ("EEPROM") having an erase mode for erasing data from the memory, a write mode for writing data to the memory, and a read mode for reading data from the memory, comprising:
   a plurality of word lines;
   a plurality of bit lines crossing the word lines to form word line - bit line pairs;
   a common line;
   a plurality of setable threshold, single transistor memory cells respectively associated with the word line - bit line pairs, said memory cells acquiring a first threshold when erased, the first threshold when presented with a particular logic value when written, and a second threshold when presented with the opposite logic value when written, and each memory cell having a control terminal connected to the associated word line, a first current terminal connected to the associated bit line, and a second current terminal connected to the common line; and
   a multiple voltage source connected to the word lines, the bit lines, and the common line for furnishing in read mode an operating voltage to the memory cells, a select voltage to at least one word line, and a deselect voltage to the other word lines, the select voltage being of a magnitude and polarity between the first threshold and the second threshold, and the deselect voltage being is of a magnitude and polarity not between the first threshold and the second threshold.

30. A method for operating a single transistor memory cell in various modes of operation, comprising the steps of:
   providing a field effect transistor having a control gate, a floating gate, a first source/drain, and a second source/drain, a portion of the first source/drain being insulated from a portion of the floating gate by a tunnel dielectric;
   providing in a first mode a first voltage across the control gate and the first source/drain to cause the transistor to assume a first threshold through electron tunneling;
   providing in a second mode a second voltage across the control gate and the first source/drain to cause the transistor to change from the first threshold to a second threshold through electron tunneling when the transistor is a selected transistor being presented a particular logic value, and otherwise not to cause the transistor to change from the first threshold, the voltage on the control gate in the second mode having a polarity opposite the voltage on the control gate in the first mode; and
   providing in a third mode an operating voltage across the first source/drain and the second source/drain, and providing a third voltage across the control gate and the second source/drain between the first threshold and the second threshold when the transistor is a selected transistor, and otherwise not between the first threshold and the second threshold.

31. A memory cell for an electrically erasable programmable read only memory, comprising:
   a field effect transistor having a source, a drain, a control gate, and a floating gate isolated from the drain by a dielectric that accommodates electron tunnelling when voltages on the control gate and drain differ by at least a threshold adjust voltage to adjust transistor threshold to a first threshold or a second threshold, the control gate being connected to a word line for the application of high and low level voltages thereto, the drain being connected to a bit line for the application of low level voltages thereto, and the source being connected to a common line; and
   a mode responsive voltage generator operable at various times in respectively erase mode, program mode, and read for furnishing:
      in the erase mode, a first low level voltage to the bit line and a first high level voltage to the word line, the first high level voltage being of a first polarity and differing from the first low level voltage in an amount at least as great as the threshold adjust voltage;
      in the program mode, a second low level voltage to an associated deselected bit line, a third low level voltage to an associated selected bit line, a fourth low level voltage to an associated deselected word line, and a second high level voltage to an associated selected word line, the second high level voltage being of a second polarity opposite the first polarity, differing from the second low level voltage in an amount less than the threshold adjust voltage, and differing from the third low level voltage in an amount at least as great as the threshold adjust voltage; and
      in the read mode, a fifth low level voltage of a value between the first and second threshold to an associated selected word line, and a sixth low level voltage of a value not between the first and second threshold to an associated deselected word line.

32. A memory cell as in claim 31, wherein the mode sensitive voltage generator further is operable in the erase mode for furnishing the first high level voltage to a selected word line, and is further operable in the erase mode for furnishing a seventh low level voltage to a deselected word line.

33. A memory cell as in claim 32, further having a control circuit coupled to the word line and responsive to a binary select control signal having first and second states for furnishing the first and second high level voltages and the fourth, fifth, sixth and seventh low level voltages, the control circuit comprising:
   a voltage converter having an output coupled to the word line for converting during the erase mode the first state of the select control signal into the first high level voltage or the second state into the seventh low level voltage, for converting during the program mode the second state of the select control signal into the fourth low level voltage, and for converting during the read mode the first state of the select control signal into the fifth low level voltage;
   a charge pump having an output coupled to the word line and responsive in the program mode to the first state of the select control signal for furnishing the second high level signal; and
   a pull down circuit having a terminal coupled to the word line and operable during the read mode to weakly pull down the word line to the sixth low level voltage.

34. A memory cell as in claim 33, wherein the control circuit further comprises:
   an intermediate node, the output of the voltage converter, the output of the charge pump, and the terminal of the pull down circuit being connected to the intermediate node;
   a first output field effect transistor having a gate coupled to the voltage converter, a source coupled to the voltage generator, and a drain coupled to the word line, the source receiving the first high level voltage during the erase mode, the fourth low level voltage during the program mode, and the fifth low level voltage during the read mode, and the first output transistor being responsive to the voltage converter for being on during the erase mode for a selected word line, on during the program mode for a deselected word line, and on during the read mode for a selected word line; and
   a second output field effect transistor having a gate coupled to the intermediate node, a source coupled to the word line, and a drain coupled to the voltage generator, the drain receiving the seventh low level voltage during the erase mode, the second high level voltage during the program mode, and the sixth low level voltage during the read mode, and the second output transistor being responsive to voltage on the intermediate node for being on during the erase mode for a deselected word line, on during the program mode for a selected word line, and on during the read mode for a deselected word line.

35. An electrically erasable programmable field effect memory cell associated with a select line and a data carrying line for storing data, the memory cell comprising during program mode:
   a drain coupled to the data carrying line and having a first potential when the data carrying line indicates a first logical state and a second potential when the data carrying line indicates a second logical state;
   a source;
   a floating gate overlapping the drain and disposed over a channel region between the source and the drain and insulated therefrom by a dielectric; and
   a control gate overlapping the floating gate and coupled to the select line and having a potential therefrom that relative to the first drain potential supports electron tunneling through the dielectric from the floating gate to the drain, and relative to the second drain potential prevents electron tunneling through the dielectric from the floating gate to the drain.

36. A memory cell as in claim 35 wherein the control gate potential is negative and the first drain potential is positive.

37. A memory cell as in claim 35 wherein the control gate potential is negative, the first drain potential is positive, and the second drain potential is zero.

38. A memory cell as in claim 37 wherein the control gate potential is minus fifteen volts, and the first drain potential is plus five volts.

39. An electrically erasable programmable field effect memory cell associated with a select line and a data carrying lane for storing data, the memory cell comprising during erase mode:
   a drain coupled to the data carrying line and having a negative potential therefrom;
   a source;
   a floating gate overlapping the drain and insulated therefrom by a dielectric; and
   a control gate overlapping the floating gate and coupled to the select line and having a potential therefrom that relative to the drain potential supports electron tunneling through the dielectric from the drain to the floating gate.

40. An electrically erasable programmable field effect memory cell associated with a select line and a data carrying line for storing data, the memory cell comprising during erase mode:
   a drain;
   a source coupled to a common lane having a negative potential therefrom;
   a floating gate overlapping the source and insulated therefrom by a dielectric; and
   a control gate overlapping the floating gate and coupled to the select line and having a potential therefrom that relative to the source potential supports electron tunneling through the dielectric from the source to the floating gate.

41. An electrically erasable programmable field effect memory cell associated with a select line and a data carrying line for storing data, the memory cell comprising during erase mode:
   a drain;
   a source;
   a floating gate insulated from a channel region between the source and the drain by a dielectric, the channel region being biased with a negative potential; and
   a control gate overlapping the floating gate and coupled to the select line and having a potential therefrom that relative to the bias potential supports electron tunneling through the dielectric from the channel region to the floating gate.

42. An electrically erasable programmable field effect memory cell associated with a select line and a data carrying line for storing data, the memory cell comprising during erase mode:
- a drain coupled to the data carrying line and having a negative potential therefrom;
- a source;
- a floating gate overlapping the drain and a channel region between the drain and the source, and insulated from the drain and the channel region by a dielectric, the channel region being biased with the negative potential; and
- a control gate overlapping the floating gate and coupled to the select line and having a potential therefrom that relative to the negative potential supports electron tunneling through the dielectric from the drain and the channel region to the floating gate.

43. An electrically erasable programmable field effect memory cell associated with a select line and a data carrying line for storing data, the memory cell comprising during erase mode:
- a drain;
- a source;
- a floating gate overlapping the drain, the source, and a channel region between the drain and the source, and insulated from the drain, the source, and the channel region by a dielectric;
- wherein at least one of the drain, the source, and the channel region is biased with a negative potential; and
- a control gate overlapping the floating gate and coupled to the select line and having a potential therefrom that relative to the negative potential supports electron tunneling through the dielectric to the floating gate.

44. A deselected electrically erasable programmable field effect memory cell associated with a select line and a data carrying line for storing data, the memory cell comprising during read mode:
- a drain coupled to the data carrying line and having a precharge voltage therefrom;
- a source having a reference voltage;
- a floating gate for representing a first logical state when having a negative charge due to an accumulation of electrons and a second logical state when having a positive charge due to a depletion of electrons; and
- a control gate overlapping the floating gate and coupled to the select line and having a negative potential preventing conduction in a channel region between the source and the drain when the second logical state is represented on the floating gate.

45. A memory cell as in claim 44 wherein the precharge voltage is five volts, the reference voltage is zero volts, and the control gate potential is minus two volts.

* * * * *